United States Patent [19]

Esashika

[11] 3,906,310

[45] Sept. 16, 1975

[54] PROTECTIVE CIRCUIT FOR A MAIN TRANSISTOR IN A MONOLITHIC INTEGRATED CIRCUIT

[75] Inventor: Tadashi Esashika, Hatano, Japan

[73] Assignee: Sony Corporation, Tokyo, Japan

[22] Filed: Oct. 15, 1973

[21] Appl. No.: 406,188

[30] Foreign Application Priority Data

Oct. 16, 1972 Japan .............................. 47-103384

[52] U.S. Cl. .................. 317/33 VR; 323/9; 323/19; 323/20; 323/22 T

[51] Int. Cl.$^2$ .......................................... H02H 3/10

[58] Field of Search ........ 317/235 E, 235 Q, 235 T, 317/33 VR, 41; 323/9, 19, 22 T, 68, 20

[56] References Cited

UNITED STATES PATENTS

| | | | |
|---|---|---|---|
| 3,278,853 | 10/1966 | Lin | 317/235 E |
| 3,370,995 | 2/1968 | Lowery et al. | 317/235 E |
| 3,383,614 | 5/1968 | Emmons et al. | 317/235 T |
| 3,480,852 | 11/1969 | Han-Min-Hung | 317/33 VR |
| 3,567,965 | 3/1971 | Weinerth et al. | 317/235 T |

*Primary Examiner*—James D. Trammell
*Attorney, Agent, or Firm*—Hill, Gross, Simpson, Van Santen, Steadman, Chiara & Simpson

[57] ABSTRACT

A protective circuit for a power or other main transistor in a monolithic integrated circuit is provided which gives protection for any potentially destrucive rise in temperature of such transistor. A temperature sensing Zener diode and one or more normal diodes are located in the same substrate and in position where they are directly subject to any rise in temperature of the main transistor. Through a particular circuit arrangement, the main transistor will be turned off when its temperature rises a predetermined value below its destructive value. This is accomplished by utilizing a circuit in which as the temperature of the Zener diode rises the voltage across the Zener diode rises due to its positive temperature coefficient and voltage across the ordinary diode decreases due to its negative temperature coefficient. The Zener diode and the normal diode are connected in a circuit in which the two diodes, one having a positive coefficient and the other have a negative temperature coefficient, acting together provide a control voltage which modifies the base bias of the main transistor to cut off the main transistor when the temperature of the main transistor reaches a predetermined point, such for example as about 160°C.

The protective circuit of the present invention is particular useful in combination with a circuit which provides protection against excessive load current in the output of the main transistor, such as might be caused by a short circuit. It is also useful in combination with a voltage controlled circuit.

4 Claims, 3 Drawing Figures

PROTECTIVE CIRCUIT FOR A MAIN TRANSISTOR IN A MONOLITHIC INTEGRATED CIRCUIT

FIELD OF THE INVENTION

This invention relates to the field where means is provided to protect a main transistor from destructive heating by cutting off the main transistor which is part of a monolithic integrated circuit.

Temperature sensing arrangements in the past have been employed using thermistors to compensate the current through the main transistor. Differential amplifiers per se are well known. It is also known to provide means for rendering the main transistor inoperative when a short circuit occurs.

BRIEF SUMMARY OF THE INVENTION

The present invention provides an arrangement for preventing destruction of a main transistor in a monolithic integrated circuit which includes using a Zener diode having a positive temperature coefficient and a normal diode having a negative temperature coefficient in coacting circuit arrangement for deriving a control voltage which is applied to the main transistor to effect the bias thereof and cut the same off.

The present invention provides a novel circuit arrangement for a main transistor in a monolithic integrated circuit.

A further object is to provide a novel temperature sensing means for detecting an abnormal rise in temperature of a main transistor and to immediately shut off further operation of such a transistor. Another object is to provide a new and now combination of a temperature sensing means and a short circuit or overload detecting means.

Still another object is to provide a novel constant voltage circuit including a temperature sensing circuit and an overload protection circuit.

BRIEF DESCRIPTION OF THE DRAWINGS

In FIG. 1, one of the preferred embodiments is illustrated, in which a main transistor for a constant voltage circuit can be protected from a heat destruction. A transistor for controlling a power transistor $Q_7$ is connected in series between an input terminal ($t_{in}$), to which an input DC voltage $V_{in}$ is applied, and an output terminal ($t_{out}$). A certain output voltage can be detected by bleeder resistors $R_{12}$, $R_{13}$ which is compared with a reference voltage (Vr) by a differential amplifier consisting of transistors $Q_8$ and $Q_9$. That is, the reference voltage (Vr) is applied to base of the transistor $Q_8$ which is produced by Zener diodes $D_4$ and $D_5$ connected in series. The Zener diode shown is of a conventional design in which a transistor has its base and collector connected together either inside or externally. The detected output voltage is applied to the transistor $Q_9$ through a transistor $Q_{10}$ which constitute a so-called Darlington connection. As a result, an error voltage or output of the differential amplifier is applied to a transistor $Q_5$ from the transistor $Q_8$ and the output can be amplified by a transistor $Q_6$ by which an impedance between collector and emitter of the transistor $Q_7$ can be controlled in accordance with the output voltage ($V_{out}$).

Figure 1:
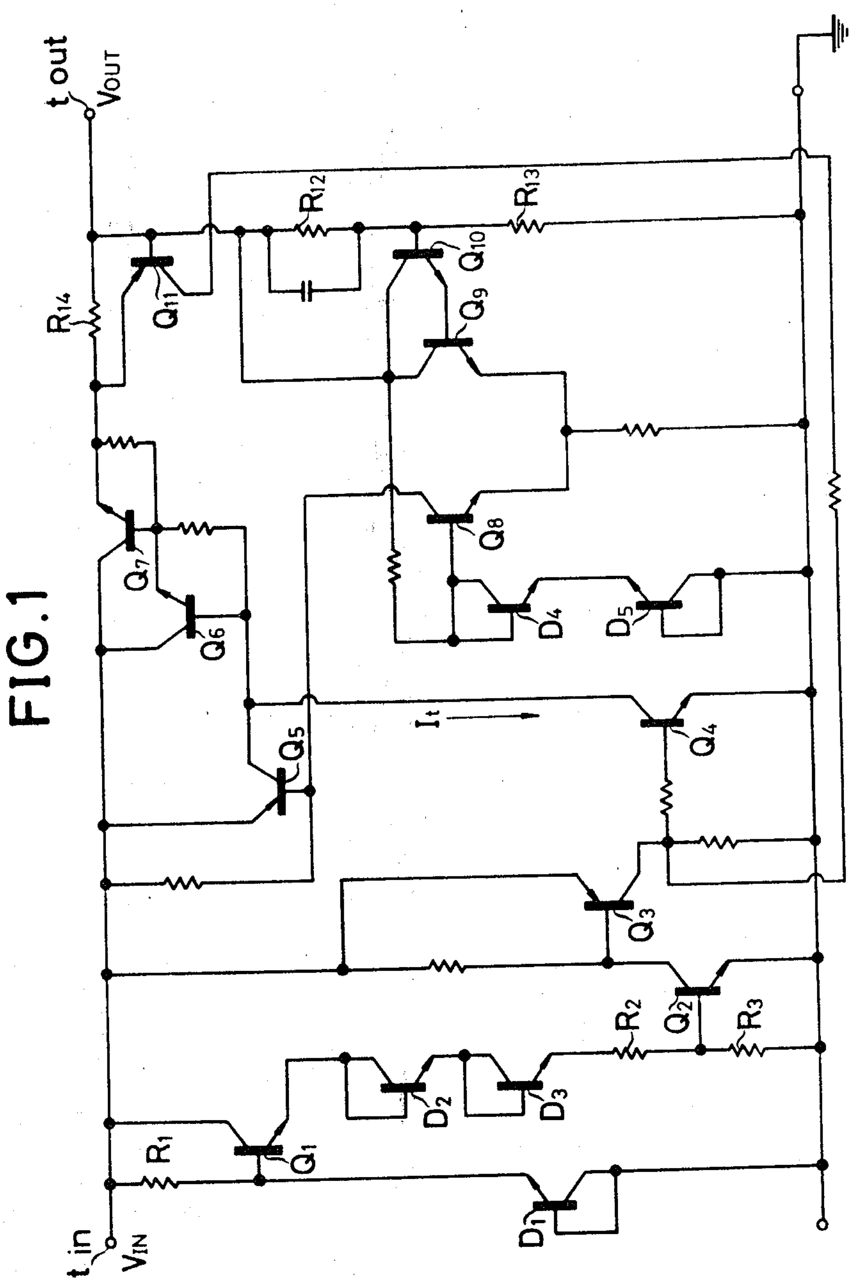
FIG. 1 is a circuit diagram illustrating a preferred embodiment of the present invention.

In such a circuit, to prevent an excess load or short at the output terminal, a protection circuit is provided where a resistor $R_{14}$ is connected between the output terminal ($t_{out}$) and emitter of the transistor $Q_7$. Upon an accident due to a certain reason, the voltage drop at the resistor $R_{14}$ can be detected by which a transistor $Q_{11}$ will be in the one state and a transistor $Q_4$ will be in the on state. The base potential of the transistor $Q_6$ connected to collector of $Q_4$ becomes ground and therefore the transistors $Q_6$ and $Q_7$ are turned off and circuit protection from heat destruction is accomplished.

According to this invention, a specific circuit sensing the temperature at or near the main transistor $Q_7$ is provided. For this purpose, a constant voltage diode or Zener diode $D_1$ is provided such for example as a diode provided by a conventional transistor having its base and collector connected to each other. It should be noted that the diode $D_1$ has a positive temperature coefficient whose break-down voltage will increase with an increase in temperature. Furthermore, one or more constant voltage diodes $D_2$ and $D_3$ are provided, each having a negative temperature coefficient whose voltage between base and emitter will decrease with temperature increase. The diodes $D_2$ and $D_3$ may conveniently be provided by employing a conventional transistor whose base and collector are connected to each other either inside or externally and which are used in forward bias configuration. At least the Zener diode $D_1$ and diodes $D_2$ and $D_3$ are located in the neighbourhood of the main transistor $Q_7$ where the heat of the transistor $Q_7$ will directly effect the diodes mentioned above. The Zener diode $D_1$ is connected between the input terminal ($t_{in}$) and ground through a resistor $R_1$. A transistor $Q_1$ whose base is connected to the midpoint of the resistor $R_1$ and the diode $D_1$ is connected to the series connected diodes $D_2$ and $D_3$, the emitter (i.e., the cathode) of diode $D_3$ being connected to a bleeder consisting of resistors $R_2$ and $R_3$. The base of transistor $Q_2$ is connected between the bleeder resistors $R_2$ and $R_3$. Instead of the transistor $Q_2$, a transistor $Q_4$ may be used, but in this embodiment, a further transistor $Q_3$ is provided between the transistors $Q_2$ and $Q_4$. The operation may be explained as follows:

At a normal temperature, the constant voltage circut works in a conventional manner. If the temperature of transistor $Q_7$ increases, and thus the temperature of $D_1$ increases the breakdown or Zener voltage $V_z$ of the diode $D_1$ will increase and the base potential fo the transistor $Q_1$ will increase. This causes the transistor $Q_1$ to become more conductive. Further the impedances of the diodes $D_2$ and $D_3$ will decrease and the forward voltage drops will decrease. As a result, the base potential of the transistor $Q_2$ will be more conductive and the collector potential thereof will be lowered. The transistor $Q_3$ will be more conductive and the collector potential thereof will become higher (i.e. the input voltage potential). Thus the transistor $Q_4$ will be in the on state (or more conductive) and the current between the collector and the emitter will rapidly increase whereby, the transistor $Q_6$ will be off and finally the main transistor $Q_7$ will be protected due to this cut off.

Figures 2, 3:
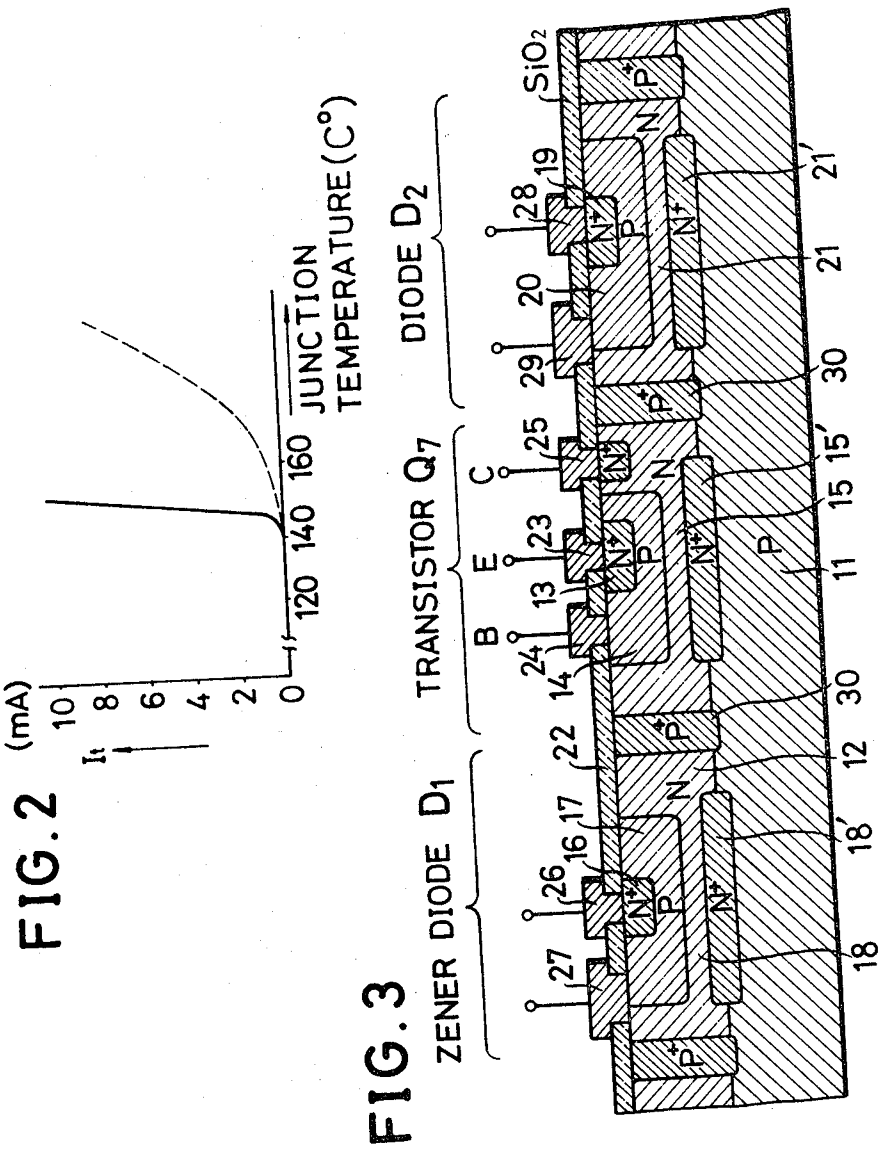
FIG. 2 is a graph showing the relationship of the collector current of the transistor $Q_4$ and the junction temperature of the main (power) transistor $Q_7$ found in the circuit of FIG. 1.
FIG. 3 is a diagrammatic illustration of a portion of a monolithic integrated circuit of FIG. 1 including the main transistor $Q_7$, Zener diode $D_1$ and the ordinary diode $D_2$.

In FIG. 2, a measurement curve (full line) between the current $I_f$ and the junction temperature of the transistor $Q_7$ is illustrated. This makes it clear that the current $I_f$ will rapidly increase at less than 160°c. Hence heat destruction can be prevented. The broken line shows the current $I_f$ in which the circuit has no temperature sensing circuit according to this invention.

FIG. 3 of the drawings, diagrammatically illustrates a portion of a monolithic integrated circuit having the Zener diode $D_1$ and a forward diode $D_2$ therein for the protection against destructive heating of a main transistor $Q_7$. A semiconductor substrate 11 of P type silicon is shown by way of illustration. An epitaxial layer 12 of N type conductivity is formed thereon. By conventional diffusion techniques the transistor $Q_7$ is formed having an N+ emitter 13 and a P base 14 and a collector 15. A buried N+ region 15' is provided for the collector.

At the same time, the Zener diode $D_1$ is formed by forming a transistor in the epitaxial layer 12. This includes an emitter 16 of N+ conductivity, a base 17 of P type conductivity and a collector 18. A buried Layer 18' of N+ type conductivity is provided for the collector. A diode $D_2$ to be forwardly biased is similarly formed and includes an emitter 19, a base 20 and a collector 21. A buried layer 21' is provided for the collector 21.

At insulating layer 22 of silicon dioxide overlies the layer 12 and has windows therein through which doping by diffusion may be accomplished. Windows also provides a means for having electrodes contact the different regions in the epitaxial layer. Specifically, electrodes 23, 24 and 25 are provided for the emitter 13, the base 14 and the collector 15 respectively. Electrodes 26 and 27 are provided for the emitter 16 and for the base 17 pointly with the collector 18 respectively of Zener diode $D_1$. It will be noted that electrode 27 contacts both base 17 as well as collector 18 and thus connects the base and collector together. Electrodes 28 and 29 are provided for the diode $D_2$. Electrode 28 contacts the emitter 19. Electrode 29 contacts both base 20 and collector 21.

The remaining portions of the curcuit of FIG. 1 may be conveniently formed in the substrate 11. Because of the close proximity of Zener diode $D_1$ and forwardly biased diode $D_2$ to the main transistor $Q_7$ an isolation ring 30 of P+ type conductivity is formed between the two diodes $D_1$ and $D_2$ and the main transistor $Q_7$. This provided PN junction isolation. It will be observed that the diffusion of the respective regions of $Q_7$, $D_1$ and $D_2$ may be carried out simultaneously by conventional diffusion techniques.

According to this invention, the temperature sensing circuit is provided under a closely related heat conductor as the main transistor. Further, both Zener $D_1$ having a positive temperature coeficient and forward diodes $D_2$ and $D_3$ having a negative temperature coeficient make a very sensitive protection circuit.

What is claimed is:

1. A protective circuit for a voltage controlled power transistor comprising differential amplifier, means connected to said power transistor to maintain a constant output voltage, overload detecting means connected to output circuit of said power transistor, means connected to said overload detecting, means for biasing said power transistor to cut-off when an overload occurs, a control transistor having a base and an emitter, temperature sensing means for detecting the temperature of the power transistor body, said temperature sensing means including a Zener diode and a forwardly bias normal diode connected in a circuit with each other, means for connecting said base and emitter to one electrode of said Zener and normal diode, respectively, and means for taking a voltage from the Zener diode-normal diode circuit to modify the bias of said control transistor and said power transistor to cut off when the temperature thereof reaches a predetermined point, the circuit of said overload detecting means and the circuit of said temperature sensing means having at least portions in common.

2. A protective circuit according to claim 1 which said Zener diode and said normal diode are subjected to substantially the same temperature conditions as said power transistor.

3. A protective circuit for power transistor comprising a Zener diode and first resistor connected in series across the input of said power transistor, a second transistor to detect variations in said Zener diode, a plurality of serially connected forwardly biased diodes connected to the output of said second transistor, a plurality of serially connected bleeder resistors connected to the cathode end of said serially connected diodes and to a reference potential, a third transistor is connected to an intermediate point of the serially connected bleeder resistors, circuit means for deriving a voltage from said third transistor which connects with base of said power transistor to render said power transistor non-conductive when its body temperature reaches a predetermined point.

4. A monolithic integrated circuit comprising a main transistor, a control transistor having base and emitter, a reversely biased first diode having positive voltage temperature coefficient, a forwardly biased second diode having negative voltage temperature coefficient, said diodes being thermally related with said main transistor, means for connecting said base and said emitter to one electrode of said first and said second diode respectively, means for connecting the other electrodes of said first and said second diode, and means for rendering said main transistor non-conductive when the emitter current of said control transistor increases.

* * * * *